US012782430B2

(12) United States Patent
Barabi et al.

(10) Patent No.: US 12,782,430 B2
(45) Date of Patent: Nov. 3, 2026

(54) SYSTEMS AND METHODS FOR TOOL-LESS, QUICK CHANGE ELASTOMERIC CONTACT INTERFACES FOR INTEGRATED CIRCUIT TESTING

(71) Applicant: Essai, Inc., Fremont, CA (US)

(72) Inventors: Nasser Barabi, Phoenix, AZ (US); Chee Wah Ho, Chandler, AZ (US); James Ray Hastings, Phoenix, AZ (US)

(73) Assignee: ESSAI, INC., Fremont, CA (US)

( * ) Notice: Subject to any disclaimer, the term of this patent is extended or adjusted under 35 U.S.C. 154(b) by 165 days.

(21) Appl. No.: 18/774,453

(22) Filed: Jul. 16, 2024

(65) Prior Publication Data

US 2025/0237697 A1 Jul. 24, 2025

Related U.S. Application Data

(60) Provisional application No. 63/623,636, filed on Jan. 22, 2024.

(51) Int. Cl.
*G01R 31/28* (2006.01)

(52) U.S. Cl.
CPC ................................ *G01R 31/2889* (2013.01)

(58) Field of Classification Search
CPC .... G01R 31/2889; G01R 1/0466; G01R 1/04; G01R 1/0408; G01R 31/2886; G01R 31/2863; G01R 1/0416

(Continued)

(56) References Cited

U.S. PATENT DOCUMENTS 4,859,189 A 8/1989 Petersen et al.
8,981,802 B2 * 3/2015 Barabi ................ G01R 1/0458 324/750.04

(Continued)

FOREIGN PATENT DOCUMENTS

CN 111208323 A 5/2020
KR 101032648 B1 5/2011

(Continued)

OTHER PUBLICATIONS

Translation of Written opinion of KR KR 20240179665 (Year: 2024).*

(Continued)

*Primary Examiner* — Christopher P McAndrew
(74) *Attorney, Agent, or Firm* — Artegis Law Group, LLP

(57) ABSTRACT

The present invention relates to systems and methods for providing an easily changeable intermediator between a semiconductor to be tested and corresponding contact points on a circuit board as a termination for test equipment and power supplies. The use of an elastomeric sheet provides a compliant landing point for the semiconductor to be tested and ensures that the elastomeric sheet is the wearing part so damage to the circuit board is minimized. A retainer which can be rapidly assembled and disassembled without tools and requires merely ordinary finger pressures and manual dexterity of an operator to achieve and allows replacement of a worn or dirty elastomer with ease. The elastomer can be preassembled as an integrated part of the removable member of the retainer to minimize the task of changeout or can be a separate independent part that is located securely in position using predetermined locating features during reassembly.

18 Claims, 15 Drawing Sheets

(58) Field of Classification Search
USPC .................................................... 324/756.01
See application file for complete search history.

(56) References Cited

U.S. PATENT DOCUMENTS

| | | | | |
|---|---|---|---|---|
| 10,725,069 | B1 * | 7/2020 | Nelson | G01R 1/0483 |
| 10,877,066 | B2 * | 12/2020 | Sterzbach | G01R 1/045 |
| 11,867,720 | B2 * | 1/2024 | Chow | G01R 1/0441 |
| 2004/0217771 | A1 * | 11/2004 | Leong | G01R 1/0466 324/754.08 |
| 2005/0229064 | A1 * | 10/2005 | Guidry | G01R 31/31917 714/742 |
| 2005/0270057 | A1 * | 12/2005 | Schaffer | G01R 1/0735 324/756.02 |
| 2012/0025860 | A1 | 2/2012 | Sun et al. | |
| 2015/0309114 | A1 * | 10/2015 | Barabi | G01R 1/0458 324/750.03 |
| 2016/0025806 | A1 * | 1/2016 | Barabi | G01R 1/06744 324/754.11 |
| 2019/0277885 | A1 * | 9/2019 | Beng | G01R 31/2886 |
| 2020/0355777 | A1 * | 11/2020 | Tong | G01R 31/31905 |
| 2022/0082609 | A1 * | 3/2022 | Hong | G01R 31/31905 |
| 2022/0299563 | A1 | 9/2022 | Ranganathan et al. | |
| 2023/0228808 | A1 | 7/2023 | Shin et al. | |

FOREIGN PATENT DOCUMENTS

| | | | |
|---|---|---|---|
| KR | 10-2010-0126130 | A | 7/2015 |
| KR | 101735774 | B1 | 5/2017 |
| KR | 10-2017-0126219 | A | 11/2017 |
| KR | 10-2017-0132628 | A | 12/2017 |
| KR | 10-2119862 | B1 | 6/2020 |
| KR | 10-2192764 | B1 | 12/2020 |
| TW | 200730828 | A | 8/2007 |
| TW | 200908450 | A | 2/2009 |
| TW | 200924326 | A | 6/2009 |
| TW | 202220295 | A | 5/2022 |
| TW | 202319753 | A | 5/2023 |
| WO | WO2017/091591 | A1 | 6/2017 |
| WO | 2021/137527 | A1 | 7/2021 |

OTHER PUBLICATIONS

Taiwanese Search Report for Application No. 113131462 dated Jul. 1, 2025.

* cited by examiner

SYSTEMS AND METHODS FOR TOOL-LESS, QUICK CHANGE ELASTOMERIC CONTACT INTERFACES FOR INTEGRATED CIRCUIT TESTING

CROSS REFERENCE TO RELATED APPLICATION

This application claims the benefit and priority of U.S. Provisional Application No. 63/623,636, filed on Jan. 22, 2024, entitled "SYSTEMS AND METHODS FOR TOOL-LESS, QUICK CHANGE ELASTOMERIC CONTACT INTERFACES FOR INTEGRATED CIRCUIT TESTING", the contents of which are incorporated herein in its entirety by this reference.

BACKGROUND

The present invention relates to systems and methods for rapid, tool-less replacement of wearing connection components in a semiconductor test jig.

Testing of semiconductor parts, especially when those parts are sophisticated integrated circuits, is a demanding task. To achieve the best advantage, semiconductor parts must be tested as early in the production process as possible and, ideally, prior to the packaging process where considerable cost can be incurred. Specialized test jigs are created for each specific application and semiconductor parts are loaded automatically into a test jig for testing and then unloaded and may be sorted or graded according to the test results. When very high volumes of parts are being tested, the component for creating adequate electrical connection between the test jig and the part being tested is subject to wear which, in turn, eventually compromises the testing. An essential aspect of test jig design is to take into account the need for frequent maintenance of wearing parts and in the case of a rapidly wearing component it is beneficial if replacement with a new part can be achieved in the least time and with the least need for skillful use of tools to effect the change. Key to reliability is to assure the operator of the test equipment or maintainer that accurate alignment of the changeable parts is certain and that improper assembly is not possible.

In low volume testing, where wear rates are low and wearing parts are changed infrequently, only when physical damage is apparent, spring probes are often used. These "bed of nails" testers are fairly common and, though costly, are reconfigurable with plug-in modules to define the connectivity; which signal is connected to which pin. Their benefit is that they are often easily interchangeable and new or prototype parts can be easily accommodated. The components that make up these testers are common to particular installations so the inventory of spare parts is generally a whole spare machine or two and the changeable parts, such as the contact pins.

Contact pin based test equipment, however, is quite intolerant of unevenly applied insertion forces and it is possible to bend these pins. Considerable effort must be employed to control accurate insertion to avoid tearing of the contact pads on the devices under test or worse, side-loading the depressible parts of the contact pins; this latter leads to internal wear in these sliding, depressible pins. The resulting change in contact resistance as seen from the testing equipment side, such as signal generators and voltage or current measuring equipment, must be constantly monitored to identify error trends so that repairs can be made without losing good semiconductor parts because of test-jig faults. Although the bed-of-nails testers may be a costlier solution, for high value parts it allows for high levels of customization, especially for high frequency operation.

High volume testing requires very rapid throughput and wearing parts must be changed frequently, sometimes several times a day. Usually a circuit board having the same correspondence of connection points as the device under test is used as an intermediator between the device under test and an array of cables carrying power and signals to and from the device. The cables are attached to a suite of test equipment at one end and the other ends terminate on this circuit board. If a device is already packaged, then it could be simply pressed into a corresponding test position on the board, such as a socket, and testing carried out. The device would then be removed from the test position and sent on to be packed for distribution to end customers for the device. It should be clear that multiple device insertions and removals would cause a typical socket to fail quickly and an alternative would have to be found.

When a device is to be tested, a one-piece fixed socketed solution is not economically practical because of the wear problems mentioned and resulting degradation in performance. A solution is needed that allows a device-under-test to be positioned quickly and be sufficiently compliant to tolerate mechanical irregularities as well as providing adequate conductivity. To achieve this, the wearing parts must be easily and quickly changed by an operator of the test station and have minimal reliance upon the need of tools for disassembly or reassembly. A solution may be found in the use of elastomeric connectors. An elastomeric connector consists of alternating conductive and insulating regions bound in an elastomer to give overall anisotropic conductive properties. The elastomer material itself is a rubber-like material having good insulating properties and excellent compliance; it can be deformed to a significant degree and yet will recover when unloaded. Conductive material which can also be a rubber-like material is embedded in the non-conductive elastomer. In one embodiment, a matrix version consists of short, fine, metallic wires aligned parallel to, but not touching each other, embedded in the elastomer sheet. In another embodiment conductive elastomeric elements made of a fine metallic powder having spherical particles, spaced apart in the elastomeric material, form an anisotropic component where compression in a specific area causes the spheres to touch and form a conductive path local only to that area whilst the neighboring regions remain non-conductive. For repeated assembly or inspection applications, as in the instant invention, the conducting elements need not protrude any significant distance from the uncompressed elastomer sheet but can be shaped and flush with the upper and lower surfaces of the sheet. Working densities of 2000 conductive paths per square centimeter are common.

By using a circuit board for connecting to external test equipment, a device to be tested can be positioned on the circuit board which has contact pads for making electrical connections. By using an elastomeric connector, as an intermediating element, wear on the circuit board can be eliminated and replaced by wear on this elastomeric connector. The compliant properties of the elastomeric connector compensate for mechanical differences between devices to be tested, but it is important that the elastomeric connector be held securely in place and not permitted to move around excessively to avoid wear on the contacts on the circuit board. The use of clamping devices to hold the elastomeric connector to the circuit board generally means that relatively skillful use of tools and a plurality of fixing components are pre-requisites for servicing or maintaining the effectiveness of a test jig.

Chinese Patent Application CN111208323A teaches a "test socket according to one embodiment includes a plurality of pins, a pin support, an elastic conductive sheet, a housing, a pusher, and a latch device". However to access the elastomeric contact sheet in CN111208323A (see FIG. 4), a specialized tool to release four latches 1232 and 1233 must be used in order to disassemble the assembly comprising of components 1400 and 1500.

In another embodiment as shown in FIG. 9 of CN111208323A, hard latches 1232 are replaced with screws or bolts 1471 which are inserted through holes 1424 in 1400 and thence into threaded holes 1228 in 1220. Spring pressure to hold the parts 1400 and 1500 apart to provide clamping force to the device under test through latches 1610 is provided by springs 1710 that locate in blind holes 1461 and matching holes or retention pegs in the corresponding corners of 1500. The assembly is constrained by snapping 1500 to 1400 where latches 1521 are held under a ridge shown at 1451. To access the elastomer sheet, the upper assembly must be removed. The operator must first dismantle this composite part, comprised of the two major parts 1400 and 1500, by levering apart the two blind latches 1521. This will require a tool since there is no other access available. Once each latch is released then the upper part 1500 will be pushed away by spring pressure and now using a suitable disassembly tool, screws or bolts 1471 can be removed to free the lower part 1400 so that the elastomeric part 1300 can be accessed. In addition to the time taken to dismantle the socket to access the elastomer, care must further be taken to ensure that latches 1610, bolts 1471 and springs 1710 are not misplaced during the operation.

It is therefore apparent that an urgent need exists for a means of avoiding the time penalties and tool use when an elastomeric connector must be changed. This improved tool-less elastomeric connector system eliminates the use of expensive spring loaded contact pins and enables rapid connector change, that can be performed by a relatively unskilled operator, with assured quality of performance and requiring no special skills or tools.

SUMMARY

To achieve the foregoing and in accordance with the present invention, systems and methods for enabling rapid tool-less change of elastomeric connectors for integrated circuit test jigs is provided. In particular the systems and methods for achieving this are suitable for use in high volume manufacturing and test facilities with minimal training for equipment operators.

In one embodiment, a changeable tool-less retainer is configured to connect a DUT to a test circuit. The retainer includes an upper housing member for mating with a lower housing member, and an interposing elastomeric sheet.

The upper housing member includes a taper for aligning the DUT by displacing the DUT along at least one lateral or rotational freedom of movement axes during insertion of the DUT. The upper member also includes a retaining latch for securely engaging with a side wall of the lower housing member. An alignment arm of the upper member is located in position while guided by locating pegs of the lower member.

In one embodiment, the elastomeric sheet is attached and positioned at the base of the upper member, wherein the two or more arms are provided to allow insertion pressure to be applied to the upper member so that it can be firmly pressed into position. In a second embodiment the elastomeric sheet is a separate component sandwiched between the upper member and a circuit board and aligned using locating pins or pegs.

In some embodiments, the latches engage positively in matching locations in the corresponding positions in the lower member wherein arms are compatible with a user finger size so that no tools are required for this assembly operation and wherein latches are provided with simple features that allow them to be released by hand so that the upper member is removed and exchanged with a new DUT without using a disassembly tool.

Note that the various features of the present invention described above may be practiced alone or in combination. These and other features of the present invention will be described in more detail below in the detailed description of the invention and in conjunction with the following figures.

BRIEF DESCRIPTION OF THE DRAWINGS

In order that the present invention may be more clearly ascertained, some embodiments will now be described, by way of example, with reference to the accompanying drawings, in which.

DETAILED DESCRIPTION

The present invention will now be described in detail with reference to several embodiments thereof as illustrated in the accompanying drawings. In the following description, numerous specific details are set forth in order to provide a thorough understanding of embodiments of the present invention. It will be apparent, however, to one skilled in the art, that embodiments may be practiced without some or all of these specific details. In other instances, well known process steps and/or structures have not been described in detail in order to not unnecessarily obscure the present invention. The features and advantages of embodiments may be better understood with reference to the drawings and discussions that follow.

Aspects, features and advantages of exemplary embodiments of the present invention will become better understood with regard to the following description in connection with the accompanying drawing(s). It should be apparent to those skilled in the art that the described embodiments of the present invention provided herein are illustrative only and not limiting, having been presented by way of example only. All features disclosed in this description may be replaced by alternative features serving the same or similar purpose, unless expressly stated otherwise. Therefore, numerous other embodiments of the modifications thereof are contemplated as falling within the scope of the present invention as defined herein and equivalents thereto. Hence, use of absolute and/or sequential terms, such as, for example, "always," "will," "will not," "shall," "shall not," "must," "must not," "first," "initially," "next," "subsequently," "before," "after," "lastly," and "finally," are not meant to limit the scope of the present invention as the embodiments disclosed herein are merely exemplary.

The present invention relates to systems and methods for a tool-less, quick-change elastomeric contact interface for a high volume, integrated circuit testing jig.

Figure 1A:
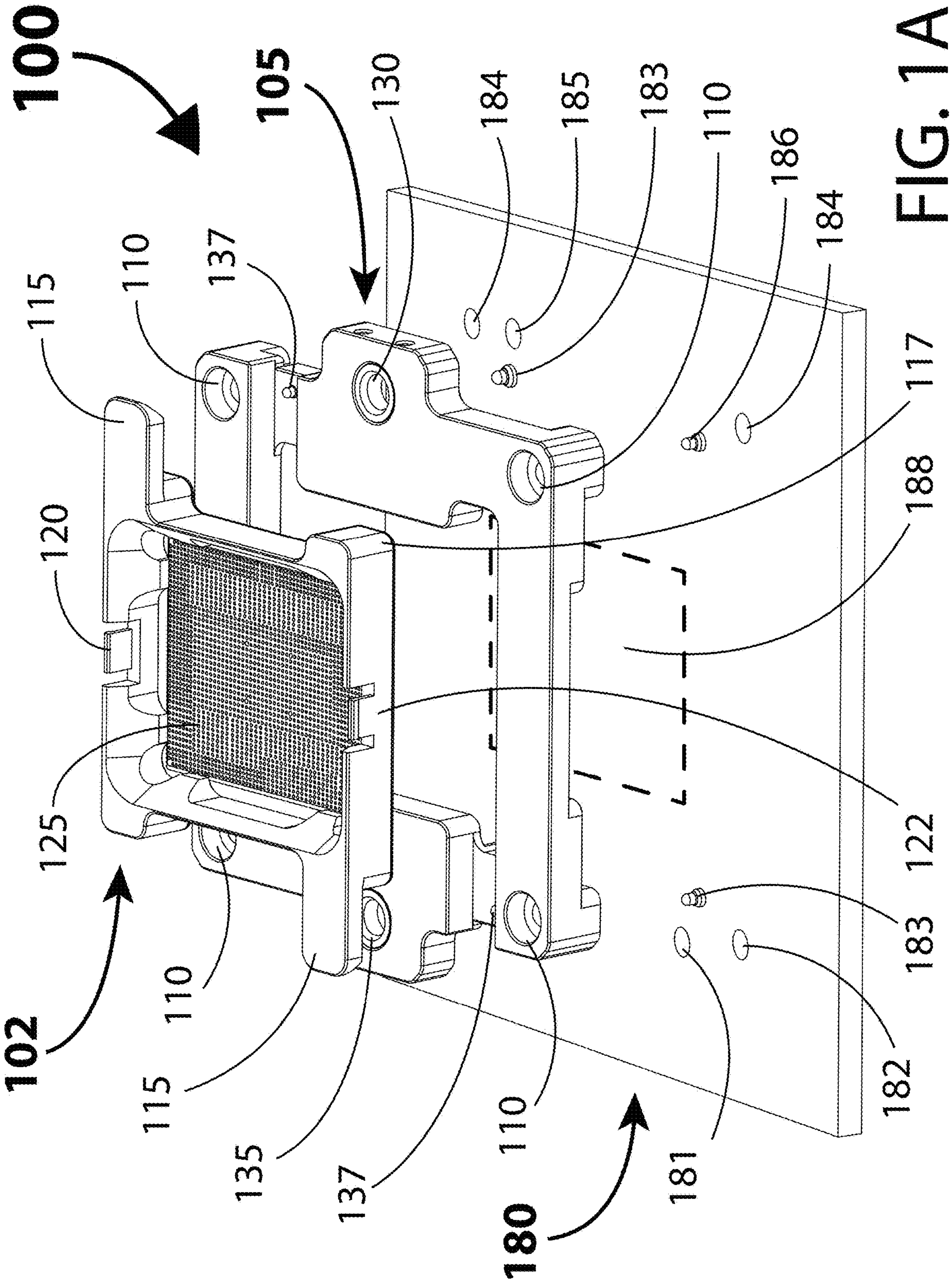
FIG. 1A is a perspective exploded view of a two-part, tool-less changeable, elastomeric contact interface, in accordance with a first embodiment.

To facilitate discussion, FIG. 1A shows a two part exploded view of retainer assembly 100 which locates an elastomeric contact pad to a test board. A circuit board, to which test cables and associated test equipment are affixed, has an area with contacts or conductive pads or lands whose layout and location correspond to the layout and location of connection points on an integrated circuit.

A semiconductor integrated circuit (IC) has contacts which connect the circuit to external components. Although these contacts may take varying form, modern electronics makes extensive use of devices whose contacts are co-planar. In finished product, the IC is attached permanently to a circuit board by attaching it to matching contacts on the board. Surface mounted parts have co-planar connection points and these may occupy one, two or four sides of a rectangular package or sometimes are located underneath the semiconductor part in an array of small hemispherical contacts. This latter is commonly referred to as a ball grid array and may be created directly on the semiconductor itself (a procedure known as "bumping") or else on the underside of a package within which the semiconductor device is contained.

To test such IC devices, a mechanism is needed that allows the device under test (DUT) to be temporarily connected to a test circuit and at the conclusion of the test allow the DUT to be removed to be further manufactured or simply packaged and sold. A compliant anisotropic conductive membrane is useful for this purpose.

In one embodiment of such a mechanism, a locating lower member 105 may be attached to a test circuit board having appropriately positioned contacts to provide connection with a DUT. This lower member 105 is made of a hard wearing material such as a stainless alloy. Screw holes 110 permit this lower member to be firmly secured to the circuit board so that the DUT can be accurately positioned relative to the circuit board contact points and connections. Locating pegs 133 shown in FIG. 1C register the lower member 105 accurately on the test circuit board 180 to which it is attached. This lower member 105 has two or more locating bushings 130 and 135 permanently fixed in it so that the position of an insertion tool that carries the DUT is determined by guide pins that fit closely into these bushings 130 and 135. In this way, if damage to this member is sustained, it can easily be exchanged for a new part with no significant positional uncertainty for the DUT. Locating pins 137 are provided to stabilize and position an upper member 102.

An upper member 102 having an interposer, e.g., an elastomeric sheet 125, attached and positioned at the base of the upper member 102 fits precisely into the lower member 105, so that the bottom of the elastomeric sheet 125 is coplanar with the bottom surface of the lower member 105 to ensure contact with the circuit board contact regions, pads or lands. The upper member 102 is made of a bearing-grade plastic material having suitable static-electricity dissipation properties; this ensures that wear is predominantly confined to this element. In practice, the conductive regions embedded in the elastomeric sheet 125 protrude slightly from the bulk of the elastomer so that when the bottom of the elastomer is flush with the bottom of the lower member 105, these protrusions will touch the contact points on the circuit board and create a small displacement of the elastomer, which tension will ensure that the protruding conduction elements remain in contact with the contact points on the circuit board.

Two or more arms 115 are provided to allow insertion pressure to be applied to the upper member with a technician's fingers so that it can be firmly pressed into position. Optional protrusions 117 at the corners of the upper member provide extra strength to resist distortion during assembly. When in position, the elastomer sheet 125 will be in intimate contact with the contact points on the test circuit board and in some implementations under slight compression between the upper member 102 peripheral structure and the circuit board.

Locating pins 137 coupled with a close fit for arms 115 ensure that there is no tendency for the upper member 102 to yaw when mated to the lower member 105. This reduces scraping motion in the plane of the contact points on the circuit board and avoids wearing movement on these contact points, prolonging the life of the circuit board itself. Retention latches 120 and 122 engage positively in matching detents in the corresponding positions in the lower member 105. Dimensionally, arms 115 are compatible with typical finger sizes so that no tools are required for this assembly operation using finger pressure alone. In one embodiment, latches 120 and 122 may be provided with simple features that allow them to be released using finger or fingernail pressures so that the upper member can be easily removed and exchanged with a new part without reliance on specific tools.

Figure 2A:
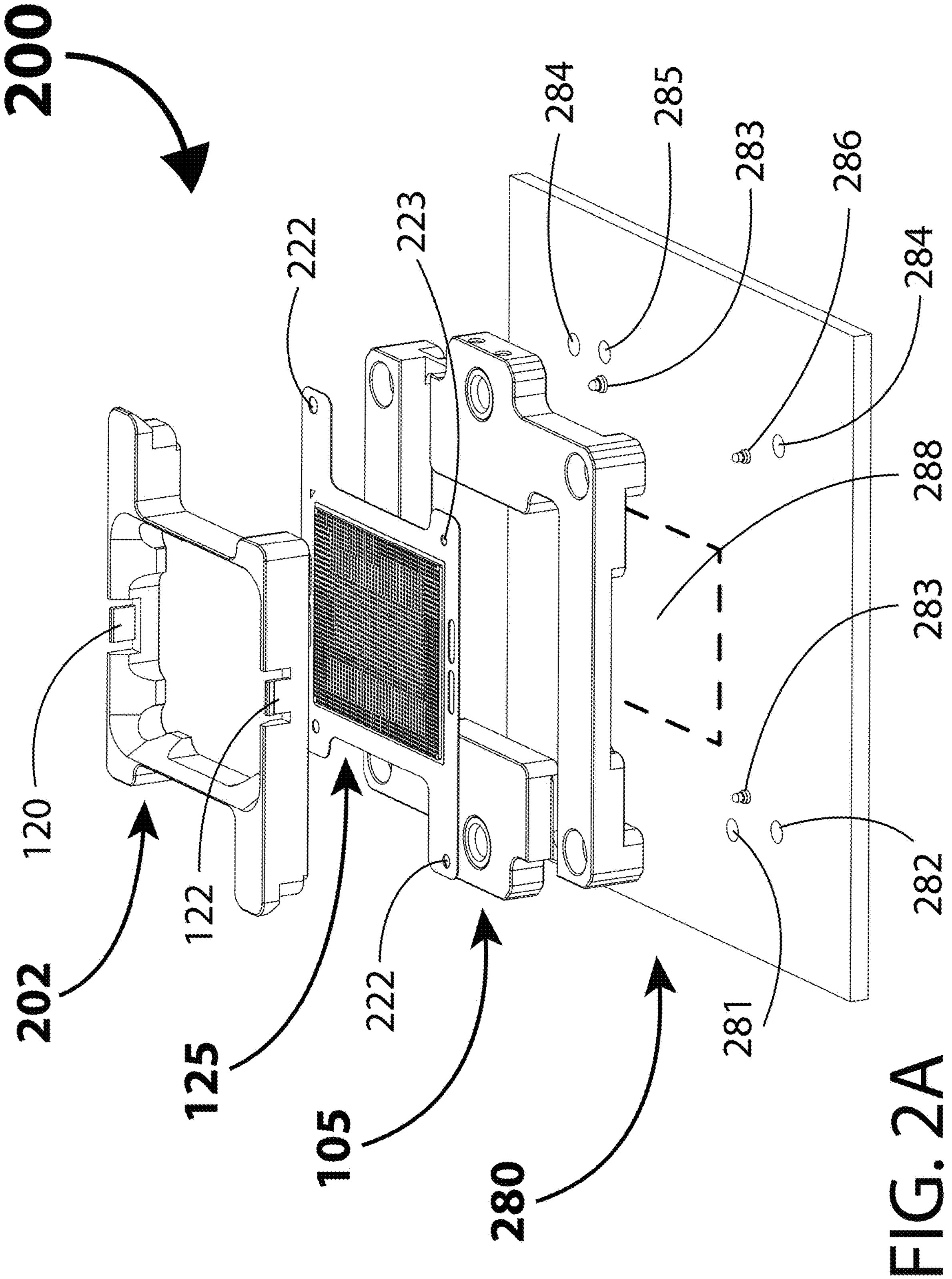
FIG. 2A shows an exploded view of a three piece construction for an elastomeric quick-change contact interface in accordance with another embodiment.

Holes 182 and 184 are clearance holes for the screws that secure the lower member 105 to the circuit board. In some embodiments, the screws may be threaded into a backing plate that may be a part of the mechanical structure that is intended to add support and strength to the test environment. In another embodiment, these holes are drilled to allow the use of threaded nutserts (insertable hard points) which are crimped in place. Alignment pins 183 are provided to aid alignment of the elastomeric sheet if this is fitted as a separate component as illustrated in FIG. 2A where holes 222 in the elastomeric sheet, also shown in FIG. 2A, allow the elastomeric sheet to be aligned when dropped into place.

Figure 1B:
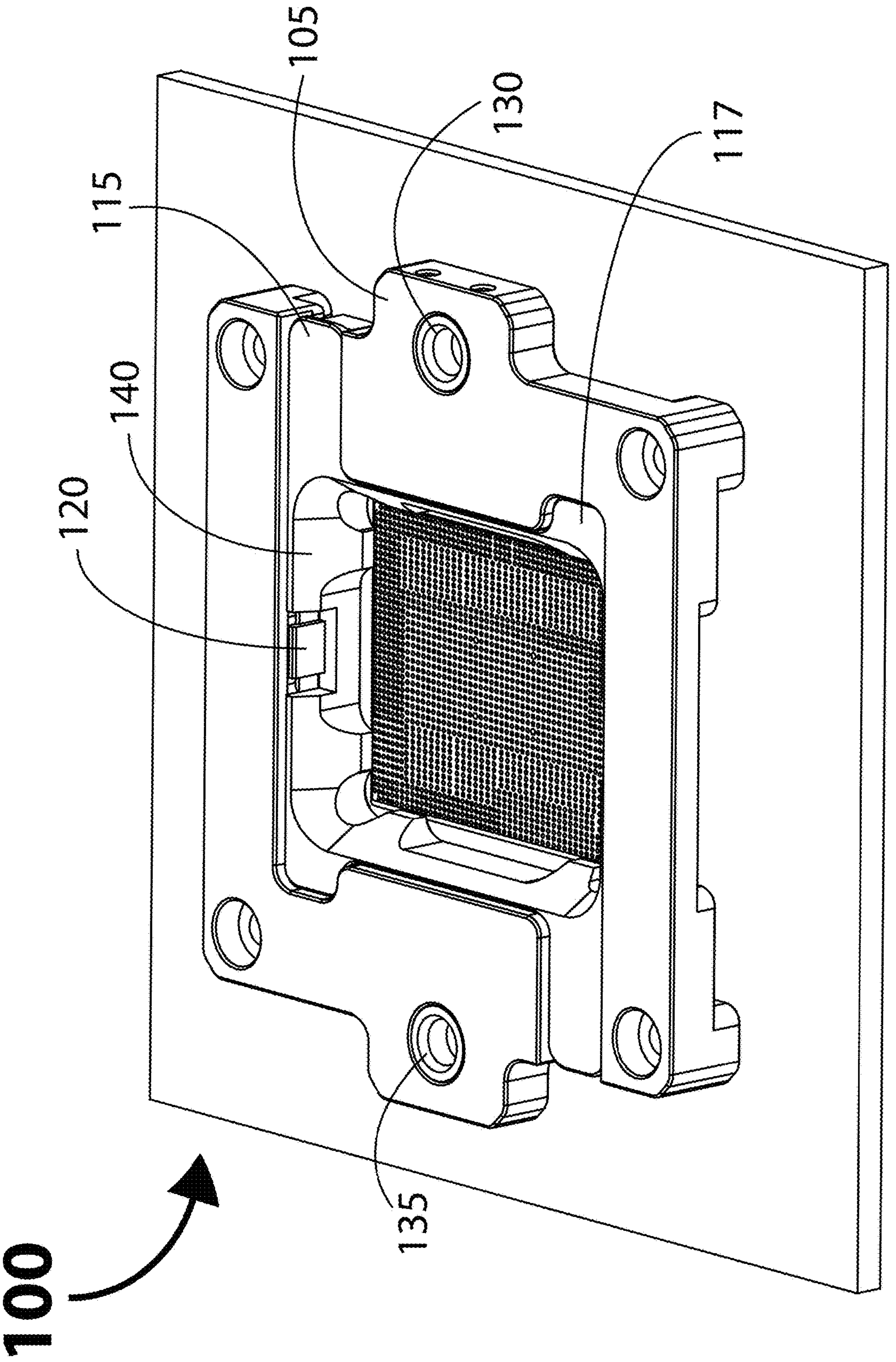
FIG. 1B shows a perspective view of the assembled two part, tool-less changeable elastomeric contact interface of FIG. 1A.
Figure 1C:
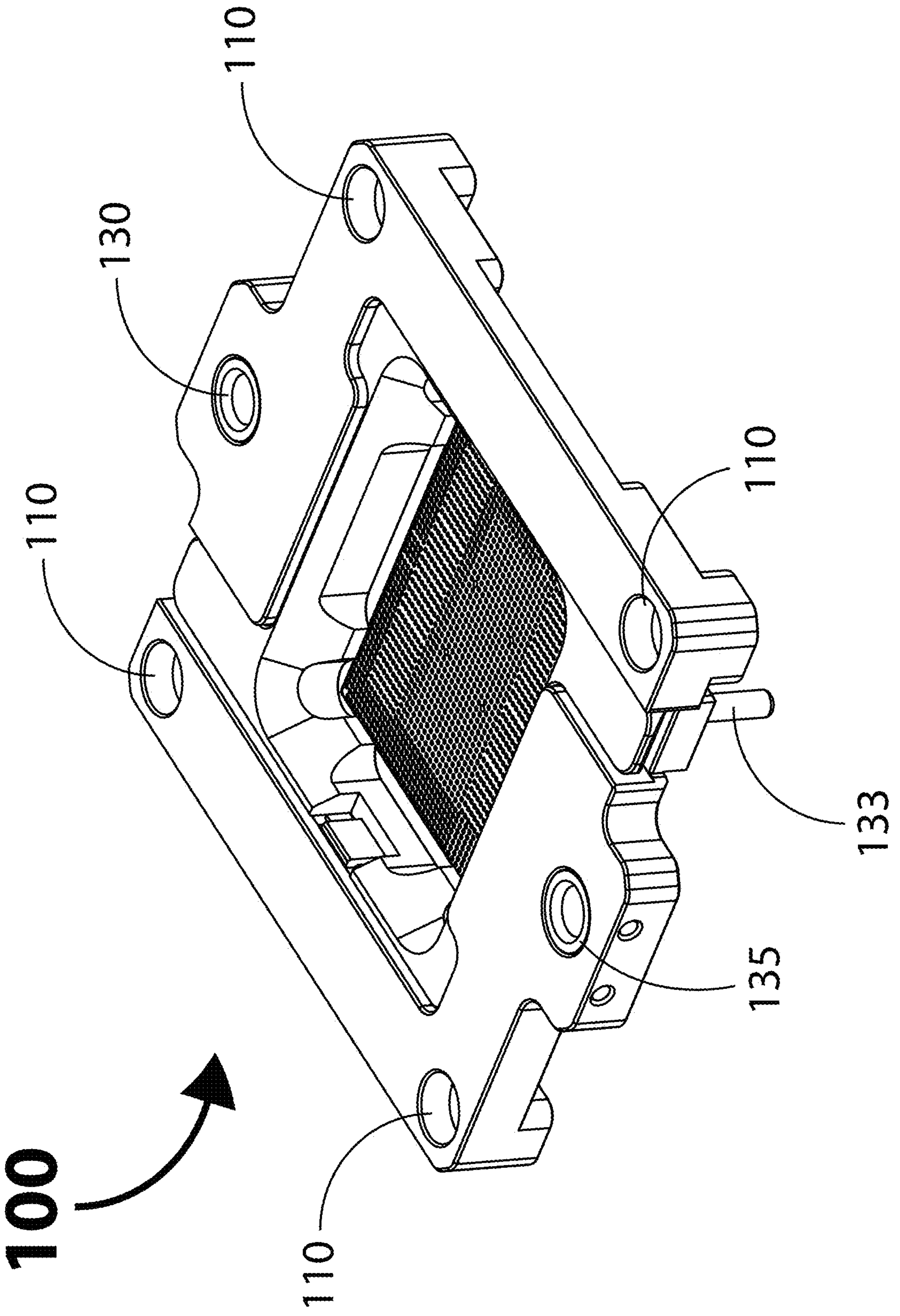
FIG. 1C shows a quarter view perspective of the two-part changeable, tool-less elastomeric contact interface with the parts mated as in normal operation.
Figure 1D:
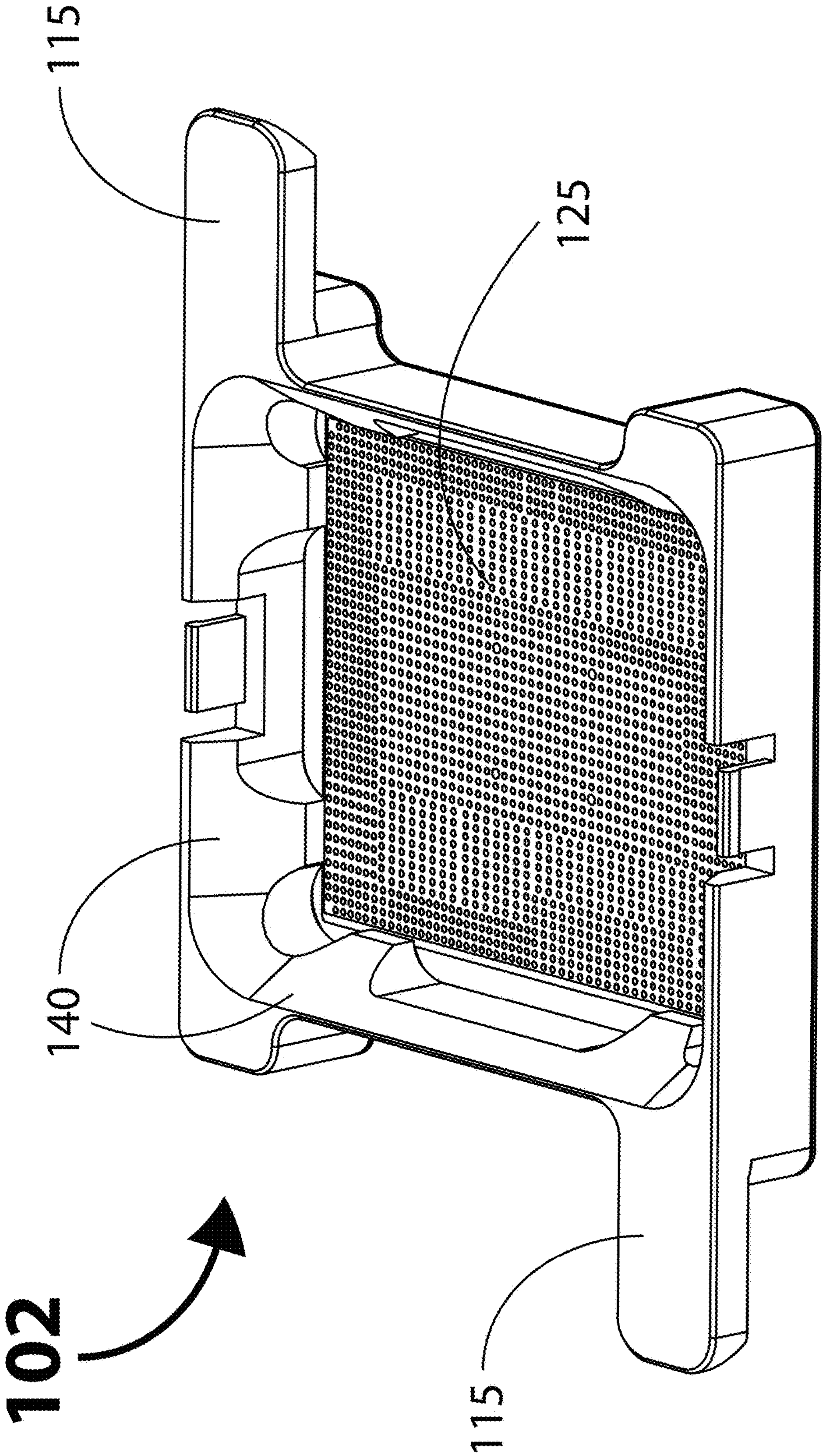
FIG. 1D shows a perspective view of an elastomeric carrier with an elastomeric sheet preassembled in place.
Figure 1E:
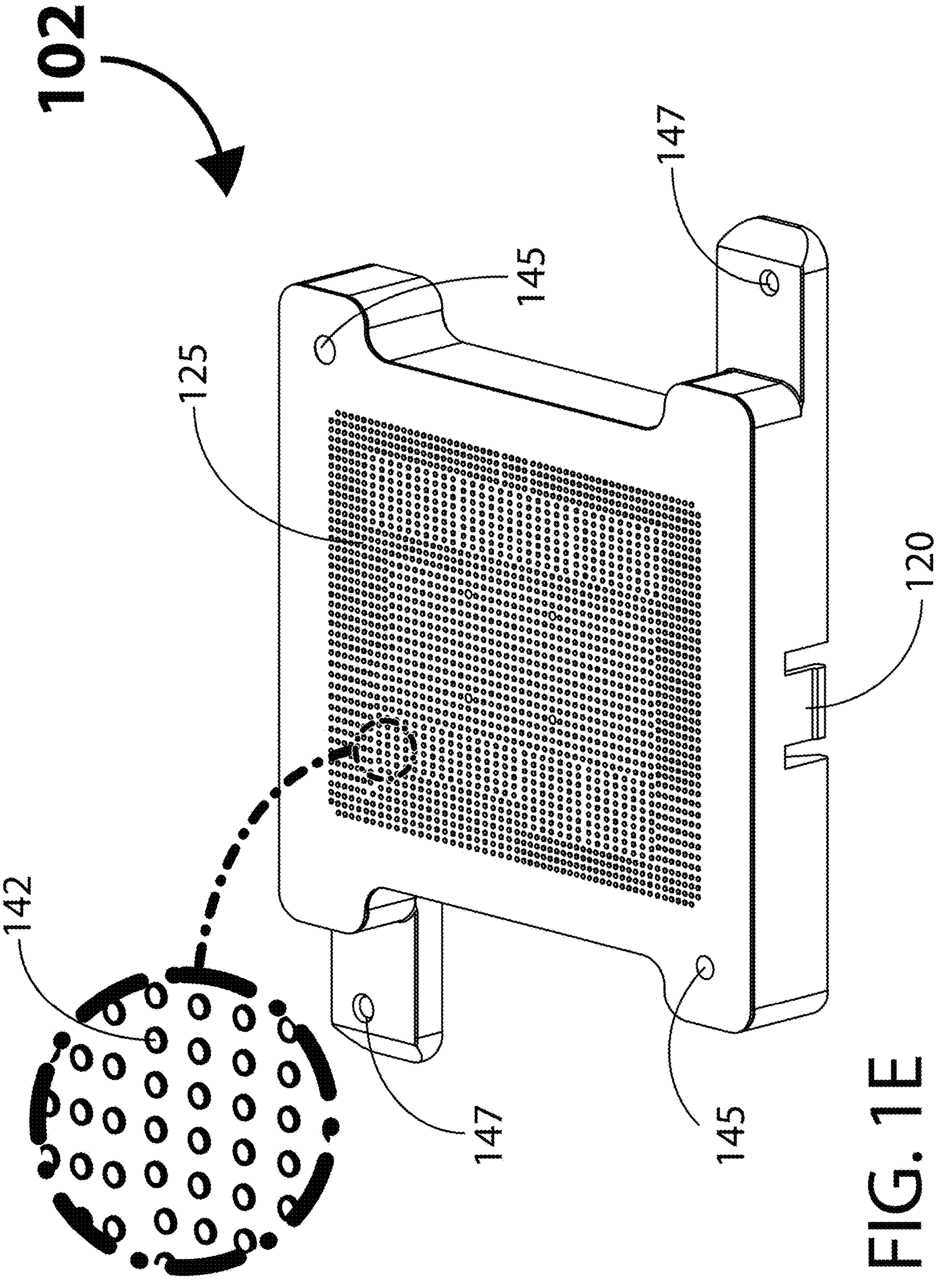
FIG. 1E illustrates the elastomeric carrier from the underside.

Finally, pin 186 is an additional alignment point that corresponds to holes 145 in the lower side of a strengthened corner 117 of upper member 102 as illustrated in FIG. 1E. The contact region over which the contact lands corresponding to the DUT contact arrangement are positioned on the test circuit board is identified as within the dashed area 188.

FIG. 1B illustrates a mated assembly of upper member 102 and lower member 105 showing latch 120 nested in its securing detent in the corresponding wall of the lower member 105. Arm 115 is located in its proper position guided by locating pegs and optional corner strengthening piece 117 seated in a matching position in the lower member. When a DUT is inserted, chucking assemblies of an insertion machine permit some freedom of movement to allow the part to be aligned so that it enters the test jig assembly without interference. Rotational uncertainty is reduced by the device insertion robot having locating pins that engage with test jig guide bushings 130 and 135; in this case the pins on a device insertion robot engage with bushings 130 and 135 in the lower member 105 so that the robot places the DUT in alignment with the contact region that is defined by the test circuit board. It is possible to use pins positioned on the lower member 105, instead of bushings, that will locate in corresponding bushings, instead of pins, on the device insertion robot, but this may hamper an operator's interaction with the jig. Tapers 140 are provided in the changeable upper member 102 to gently align the DUT by displacing the part along any or all lateral and rotational freedom-of-movement axes of the device insertion robot.

FIG. 1C shows a quartering view perspective that shows one of the alignment pegs 133 that precisely position the lower member on the test circuit board prior to securing it with screws. In this embodiment, two of these locating pegs are provided.

FIG. 1D shows a perspective of the upper member 102 viewed from above with the elastomeric contact sheet 125 permanently attached by, for example, molding or gluing it into the part. Tapered shoulders 140 are provided at selected positions on the upper member 102 that allow the DUT to be placed into the test position whilst applying alignment forces to ensure that the DUT is properly located.

FIG. 1E shows the underside of an upper member with the elastomeric conductive elements 142 captive within the elastomeric sheet 125. During the molding process for the upper member 102, the elastomer is slightly compressed at the periphery so that the part of the elastomer which will contact the circuit board is either coplanar with or slightly proud of the floor of the assembled structure to ensure that a good contact is made to the contact points on the circuit board to which the assembly is attached.

In another embodiment, the elastomeric sheet 125 is provided as a separate item that can be preassembled to the bare upper member 102. The lower periphery of the upper member is coated with an adhesive which can be either permanent or semi-permanent and this may be either a dispensed adhesive or else a double sided preformed adhesive sheet, thereafter, alignment pins are inserted into holes 145 in the floor of the strengthening corner elements 117 temporarily. The separate elastomeric sheet 125 has preformed holes in corresponding locations to that of the holes 145, similar to the elastomeric sheet shown in FIG. 2A where the holes are identified as 223, but without the extended alignment arms having holes 222, and this sheet is slipped over the temporary alignment pins and slid into position so that the adhesive layer is positively engaged. Once installed and the adhesive has set, the temporary alignment pins are withdrawn and the single assembly comprised of the upper member 102 to which the elastomeric sheet 125 has been firmly attached is now treated as described and installed into the lower member 105. Once installed within the lower member 105, pins 186 on the test circuit board provide further positive location to prevent any tendency for the elastomeric sheet 125 to displace or creep. As noted later, it is acceptable for the periphery of upper member 102 to slightly compress or pinch the elastomeric sheet against the test circuit board if locating pins 186 are absent but if present, then compression forces are not required so long as positive contact between the elastomeric sheet and the contact lands located in region 188 is maintained. Because the conductive elements of the elastomeric sheet 142 of FIG. 1E are slightly proud of the lower surface of the elastomeric sheet, the sheet is placed in slight tension when pressed against the contact lands, which tension provides the force to maintain some contact pressure between the conductive elements 142 of the elastomeric sheet and the contact lands.

An elastomeric conductive element 142 is shown in a close-up view of a portion of the elastomeric sheet 125. Dots represent the conduction path element, which may be wire filaments, or conductive spheres that are separated in the uncompressed state but touch to form a conductive path in the case where a metallic powder is used to create the anisotropy, the conduction path elements being insulated from each other by the insulating polymer but protruding slightly out of the bulk of the elastomer to ensure good contact with conductive surfaces or lands above and below the elastomeric sheet. Holes 147 are receiving holes for locating pins 137.

In some embodiments, the test circuit board is fitted with locating pins 186 that match receiving holes 145 in the floor of the upper member 102 for critical alignment. A locating protrusion or ridge in latch 120 may be better seen in the following FIGS. 1F and 1G. Note that the elastomeric contact sheet may be uniform or have differing conductive path element densities according to the design requirements of a test environment; for example, for high current paths it may be desirable to have high conductor densities but for small-signal paths a lesser density may be used.

Figure 1F:
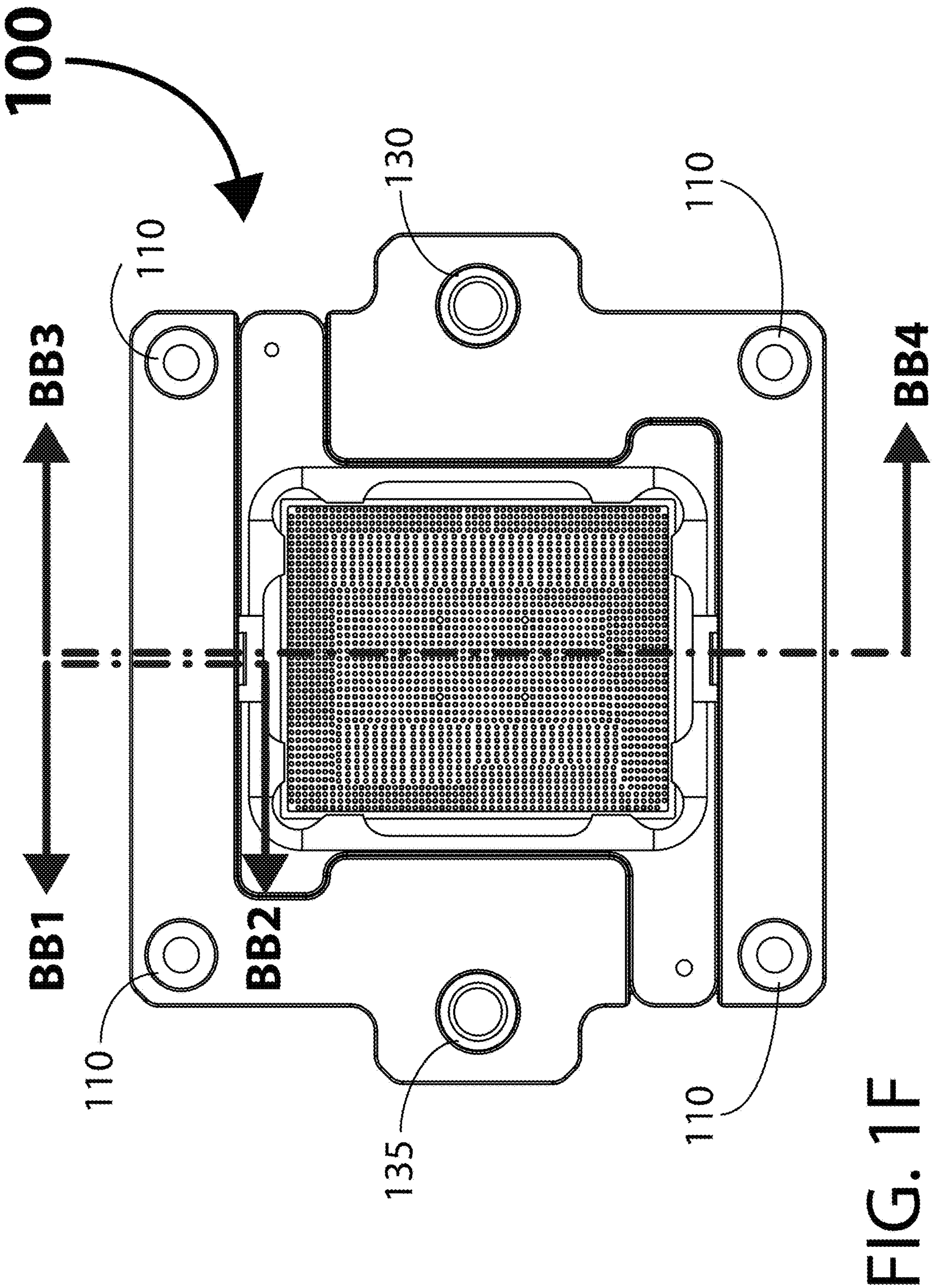
FIG. 1F shows a plan view of a mated carrier which defines a section line for exploration of the latch detail and a section line that shows the relationship of both latches.
Figure 1G:
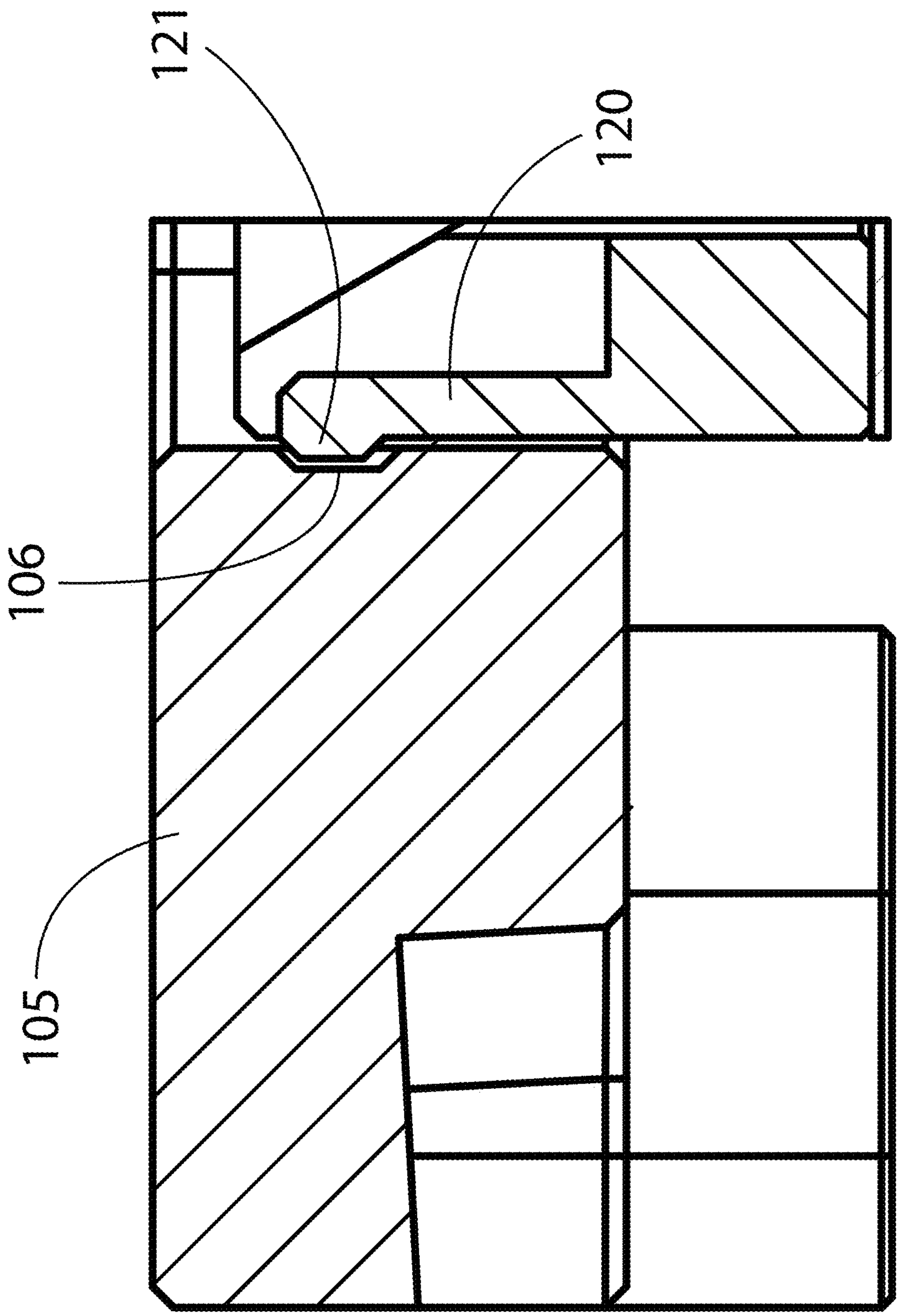
FIG. 1G illustrates in section the detail of one latch of FIG. 1F.

Turning now to FIG. 1F, this shows a plan view from above of a mated assembly 100. To explore the detail of the latch mechanism, section-line BB1-BB2 is used to illustrate the method used to secure the latch 120 and BB3-BB4 is used to show the relationship between latches 120 and 122. FIG. 1G is a cross section taken at section-line BB1-BB2. A detent 106 is cut into a corresponding wall of lower member 105. This detent may be formed as part of the molding process if a plastic material is used or may be separately machined. When the lower member is formed from a metal, the indent must be machine cut to ensure accuracy. Latch 120, formed during the manufacturing of the upper member 102, has a ridge 121 corresponding to the detent 106 formed in the lower member 105. The ridge 121 and detent 106 have matching tapers that ease the entry and exit of the latch from the detent and are arranged so that the holding force at the upper or latching taper when the latch is fully engaged prevents accidental release. The insertion taper at the lower position of the ridge can generally be a more gradual taper so as to facilitate easy deflection of the latch when the upper member is being inserted.

Figure 1H:
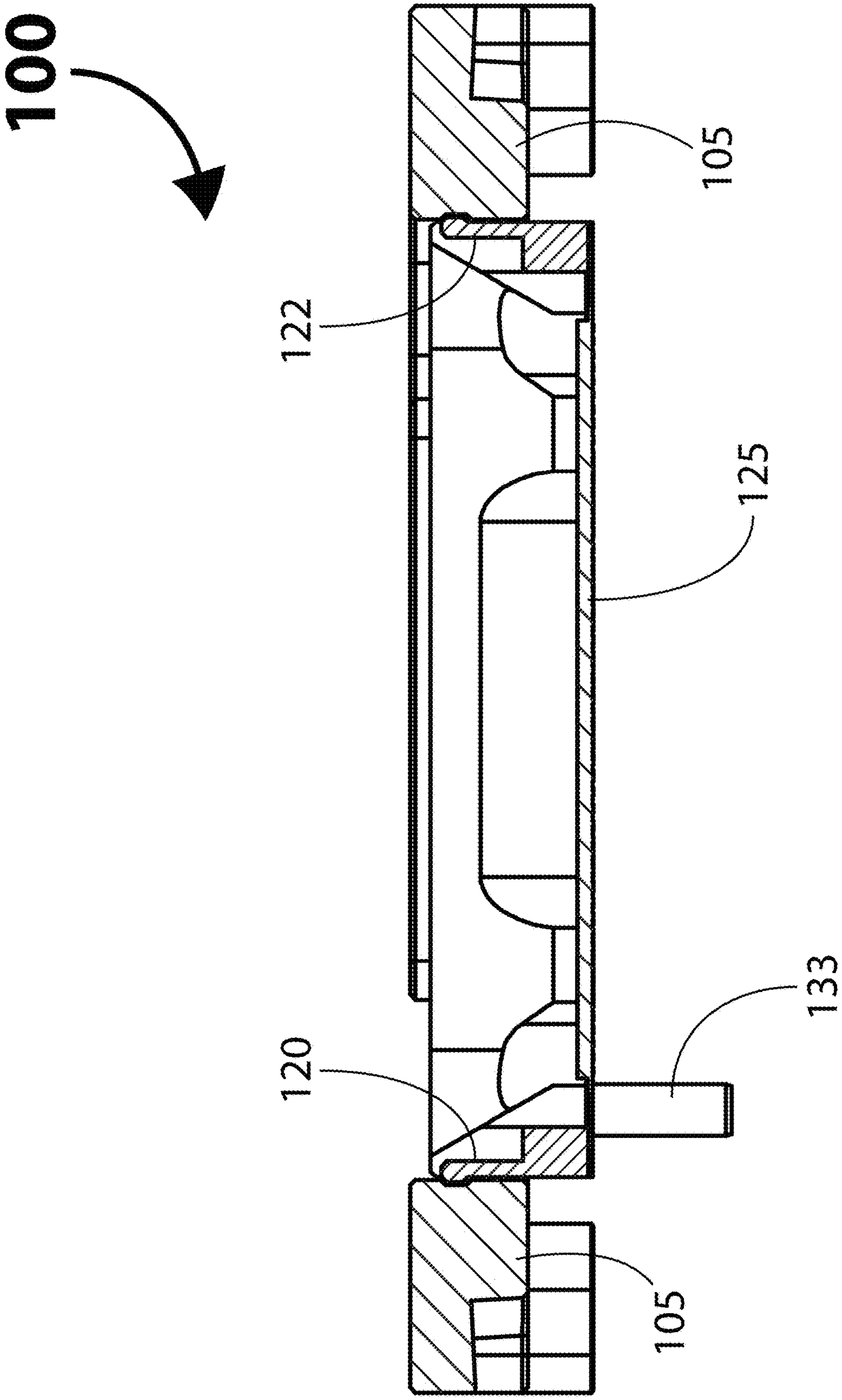
FIG. 1H illustrates in section the relationship of the two latches of FIG. 1F.

FIG. 1H shows both latches 120 and 122 located at opposite sides of the upper member 102 with elastomeric strip 125 positioned and aligned with the lower edge of the lower member 105. Each of these latches are mirror images as shown for a single latch 120 in FIG. 1G.

In some embodiments, these pegs 133 may be absent and, in this case, the screw attachment holes 110 are provided with a concentric shoulder at the underside of the lower member 105 that matches with corresponding holes in the circuit board. The holes are drilled to accept shoulders that are machined onto the base of the lower member 105 so that alignment pegs 133 of FIG. 1C are no longer required. Accordingly, holes 181 and 185 are no longer required to accommodate alignment pegs 133 of FIG. 1C.

In another embodiment 200 shown in FIG. 2A, the elastomeric sheet is provided as a separate component. For larger areas with high pin counts, this may be a better economic solution because the elastomeric sheet may be removed for cleaning prior to re-use. Whereas in the two-part embodiment the upper member and its permanently affixed elastomer are discarded when changed, in a three-part solution, the upper member 202 can be reused many times. The lower member 105 may be mounted to the circuit board 280 using screws as previously described. Holes 282 and 284 in the circuit board may either be clearance holes for the attachment screws or else be sized to accommodate shoulders that can be machined beneath the region surrounding the attachment screw holes 110 in the lower member 105. The separate elastomeric sheet 125 is aligned to the circuit board using punched holes 222 positioned over locating pins 283 on the circuit board. The upper member 102 is then pressed into place to hold the elastomer firmly in place. Because the elastomer 125 is a compliant membrane, it can be safely pinched slightly by the periphery of the upper member 102 to secure it without risk of damage to either the elastomeric sheet or to the contact points residing within the area at 288 on the circuit board 280.

In some embodiments, the elastomeric sheet is located solely by the alignment pegs 283 at matching holes, for example 222, in the elastomer. This allows the elastomer to float and avoids the risk of any permanent set that may result from pinching action that may deform the elastomer. Accumulation of debris can affect the performance of the elastomer and a sheet that is replaced need not always be disposed of, but merely cleaned. A suitable sticky material such as an adhesive tape can be used to relieve the surface of a used elastomeric sheet of debris and in stubborn cases, an ultrasonic bath using a suitable solvent may recondition the sheet. An elastomeric sheet subject to normal use may be reconditioned several times before it is no longer viable as a satisfactory component.

Holes 281 and 285 accept locating pegs 133 on the lower member 105 as shown in FIG. 1C. If locating shoulders are used concentric with the securing screw holes at the lower face of lower member 105, then these pegs may be redundant. Pin 286 provides both an additional alignment point where it passes through hole 223 in the elastomeric sheet and enters hole 145 at the lower face of upper member 202. Upper member 202 is similarly dimensioned to upper member 102 except that the elastomeric sheet 125 is not permanently secured to it.

Figure 2B:
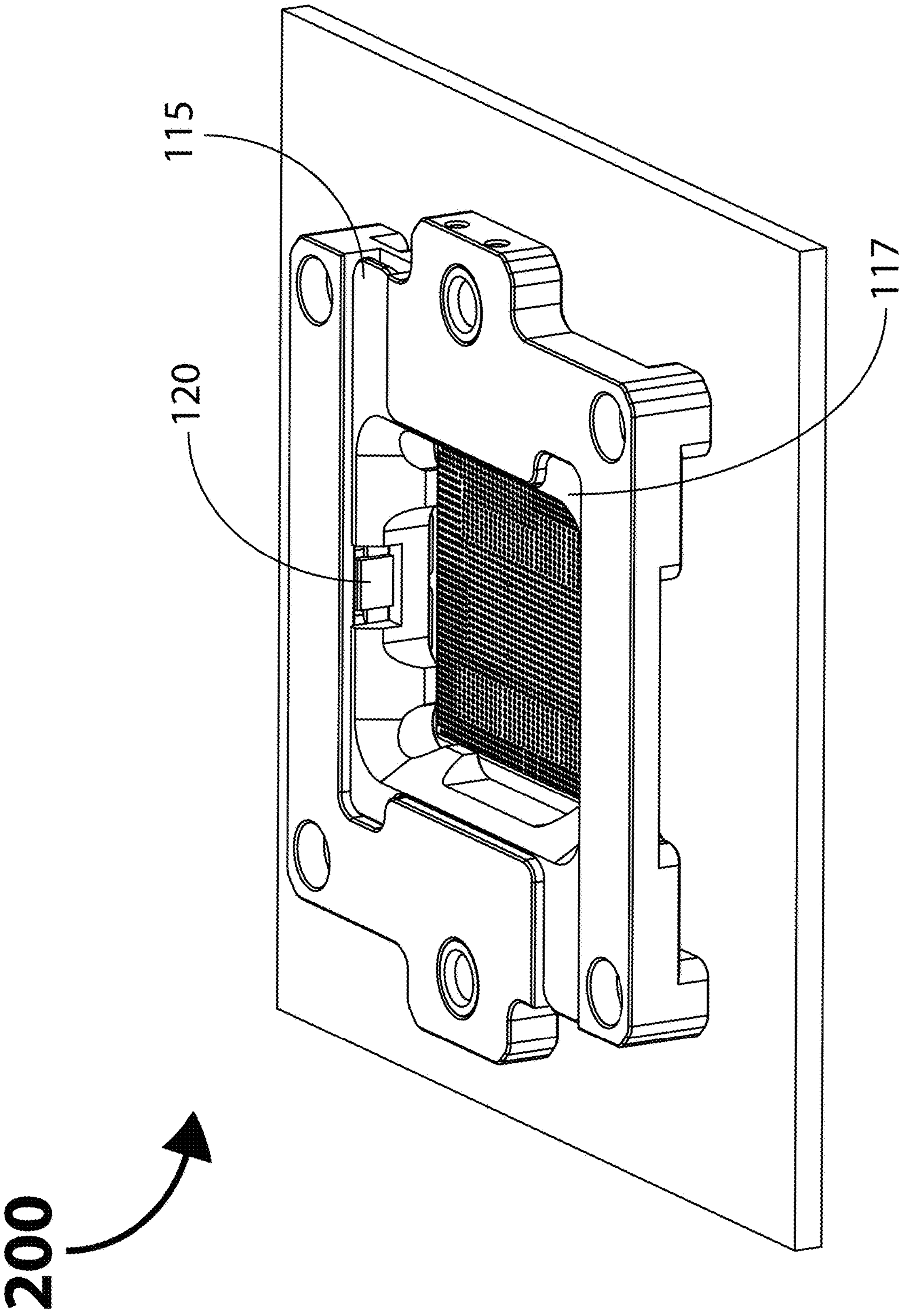
FIG. 2B shows the assembled three-piece elastomeric contact interface.

FIG. 2B shows the mated assembly of the three parts of the quick-change connector shown in FIG. 2A comprised of the upper member 202, lower member 105 and the elastomeric sheet 125, coupled to the associated circuit board, allowing connection to conductors that are printed on the circuit board—not shown on the figure to preserve clarity. Corner 117 provides added strength for the upper member 202 and also a location for a receiving hole for the additional alignment pin 286 mounted on the test circuit board 280.

Figure 2C:
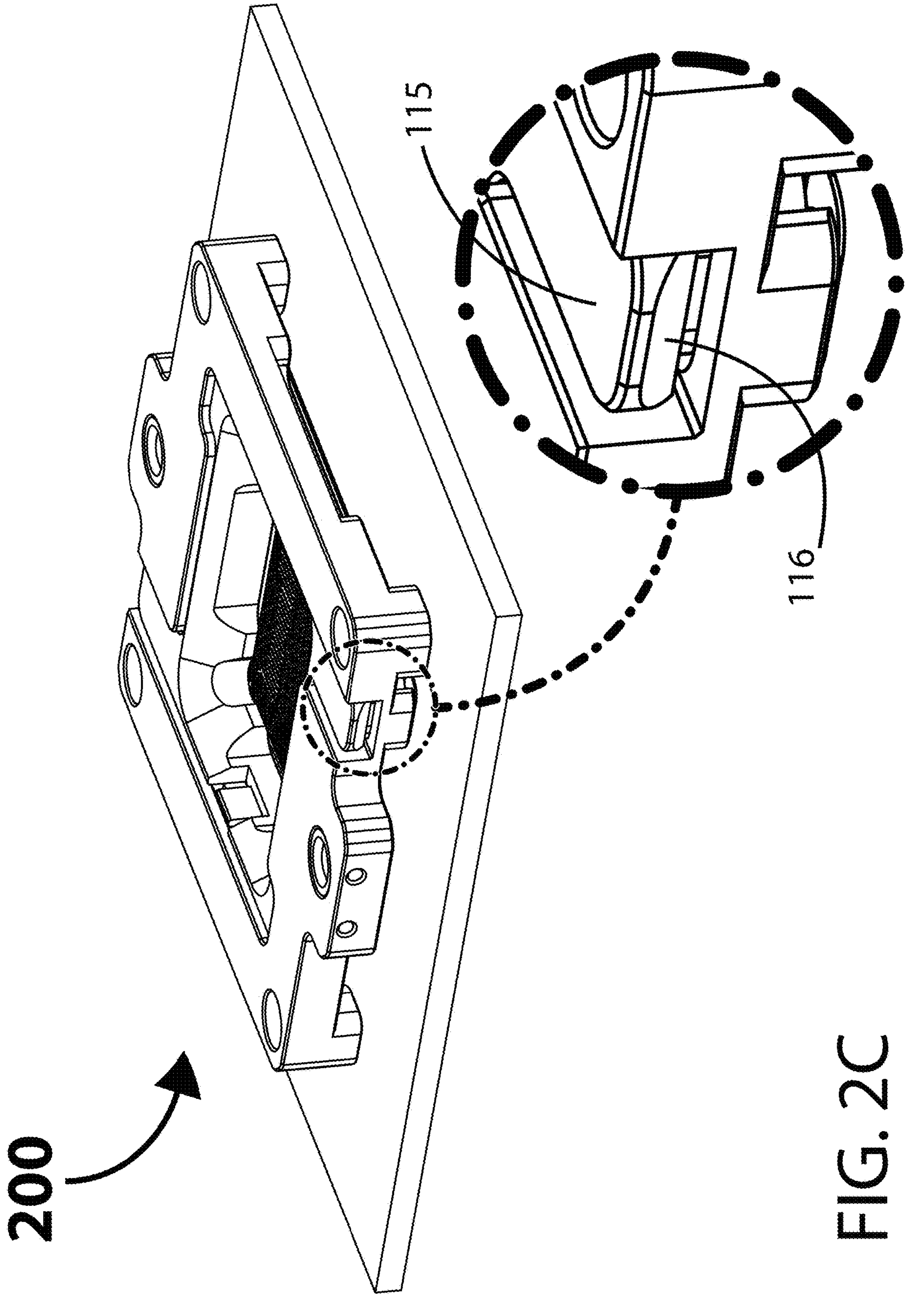
FIG. 2C is a quarter view perspective of the assembled three-piece elastomeric contact interface.

FIG. 2C is included for completeness and shows a quartering view of the assembled parts of the quick-change connector on a circuit board for better appreciation of the tool-less aspect of this embodiment. The fit is quite precise and the matching tapers 121 on latch 120 and 106 on lower member 105 as illustrated in FIGS. 1G and 1H engage closely to allow the latch to hold and yet still be able to release by the application of upward pressure. Arms 115 which are a part of the upper member serve to provide location stability as well as being useful for the application of assembly and disassembly pressures to the upper member. The underside of these arms 115 have a taper 116 that is an access point where a fingernail can be inserted to allow upward pressure to be applied. This upward pressure acts on the tapers of the latch ridge 121 against tapers on the detent 106 and this displaces the latch 120 inwards so that the upper member 102 can be disengaged.

Upward force can be applied to both arms 115 at the same time but sequential operation can also spring the latches so that the upper member 102 can be released from engagement and withdrawn from the lower member 105. Arms 115 can then be used to pull the upper member away from the assembly. The elastomeric sheet can then be removed and replaced prior to reassembly. The latches and arms may be provided with features that ease separation, such as small projections to give larger areas for fingers to manipulate in addition to the application of pressure from beneath the arms 115.

If room permits, in another embodiment the arms 115 protrude slightly from their location in the lower member to allow a more substantial finger pressure to be applied.

In some embodiments, a spring action may be used to provide an upward preload to the upper member 102 to mitigate any looseness resulting from any wear of the latches and their location detents in the lower member and provide a snap action to the release. The spring action may be provided by a discrete spring or may be incorporated into either the upper or lower member as an elastic element, such as a bendable or deformable beam.

Figure 2D:
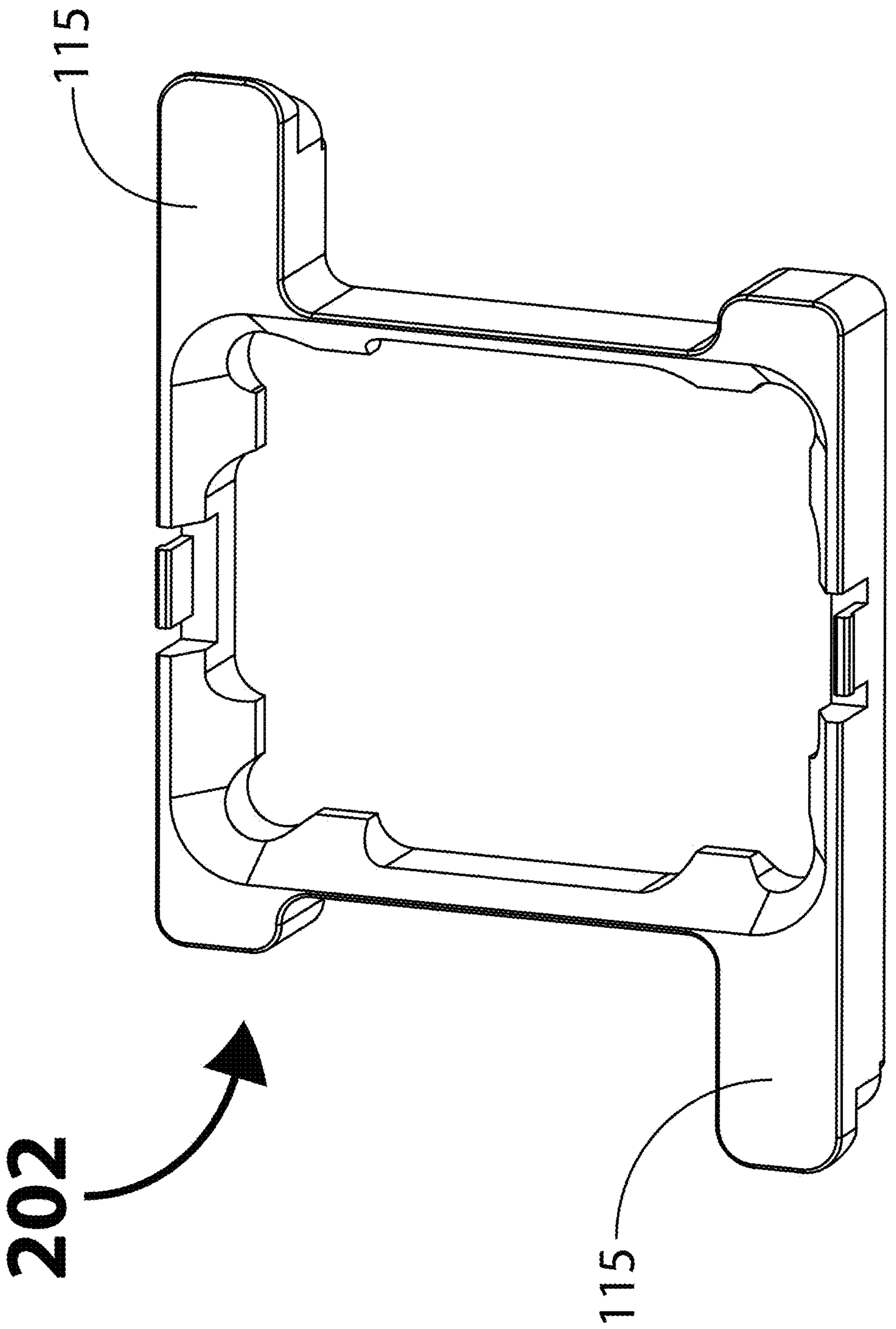
FIG. 2D is a top view of the upper component of the three-piece elastomeric contact interface.
Figure 2E:
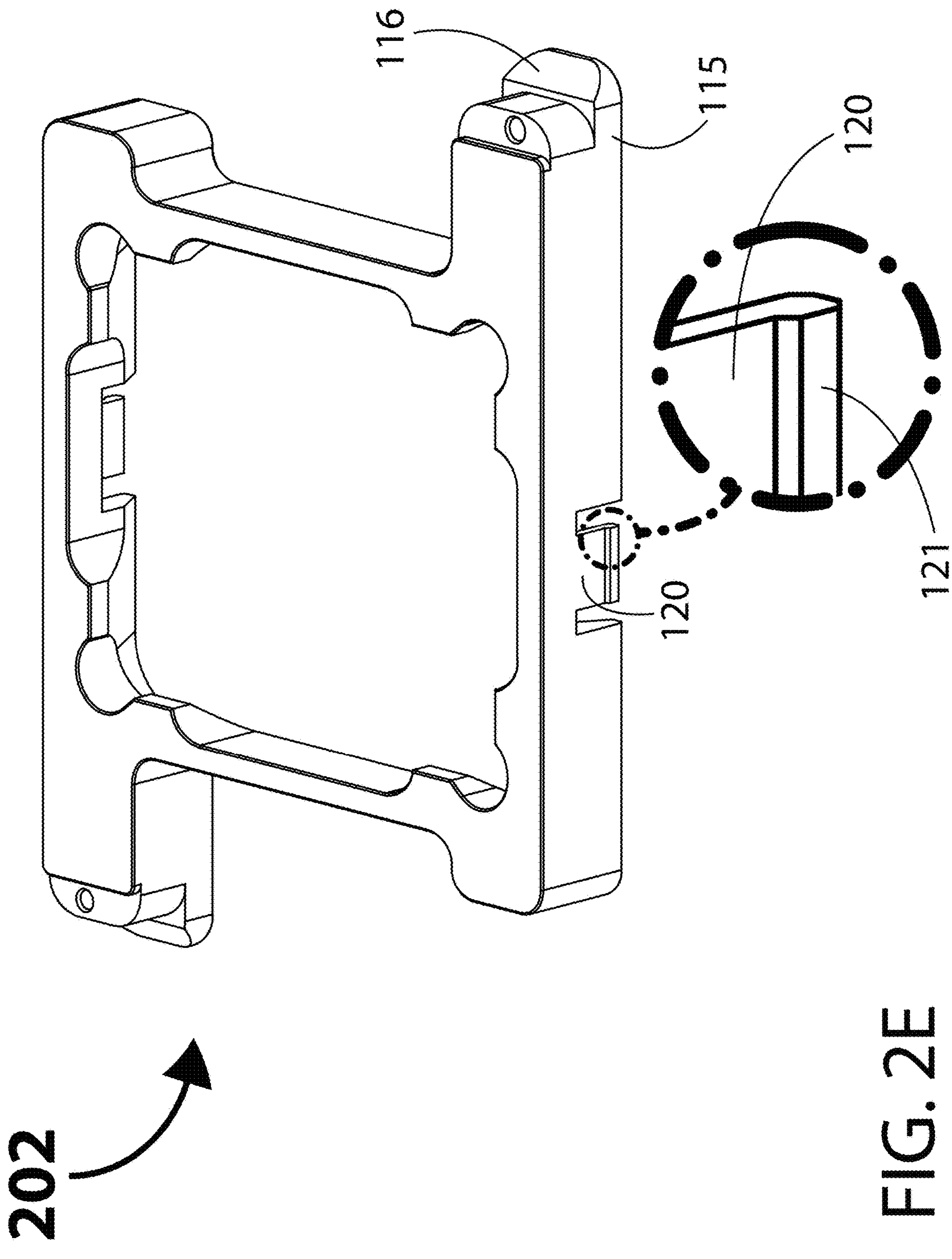
FIG. 2E is a bottom view of the upper component of the three-piece elastomeric contact interface.

Similarly, FIGS. 2D and 2E are shown for better appreciation of the structure and features of the upper member, showing an unobstructed view of the tapered shoulders that will guide the DUT into the correct alignment for testing and the flat periphery that can be used to secure the elastomeric sheet in place. In the case where the elastomeric sheet is fully floating, secured only laterally by locating pegs that pierce the corresponding location holes 222 and 223 in the elastomeric sheet, the periphery of the floor of the upper member is set at a depth that allows only a minimal clearance yet prevents the elastomeric sheet from wrinkling in this region.

Figure 3A:
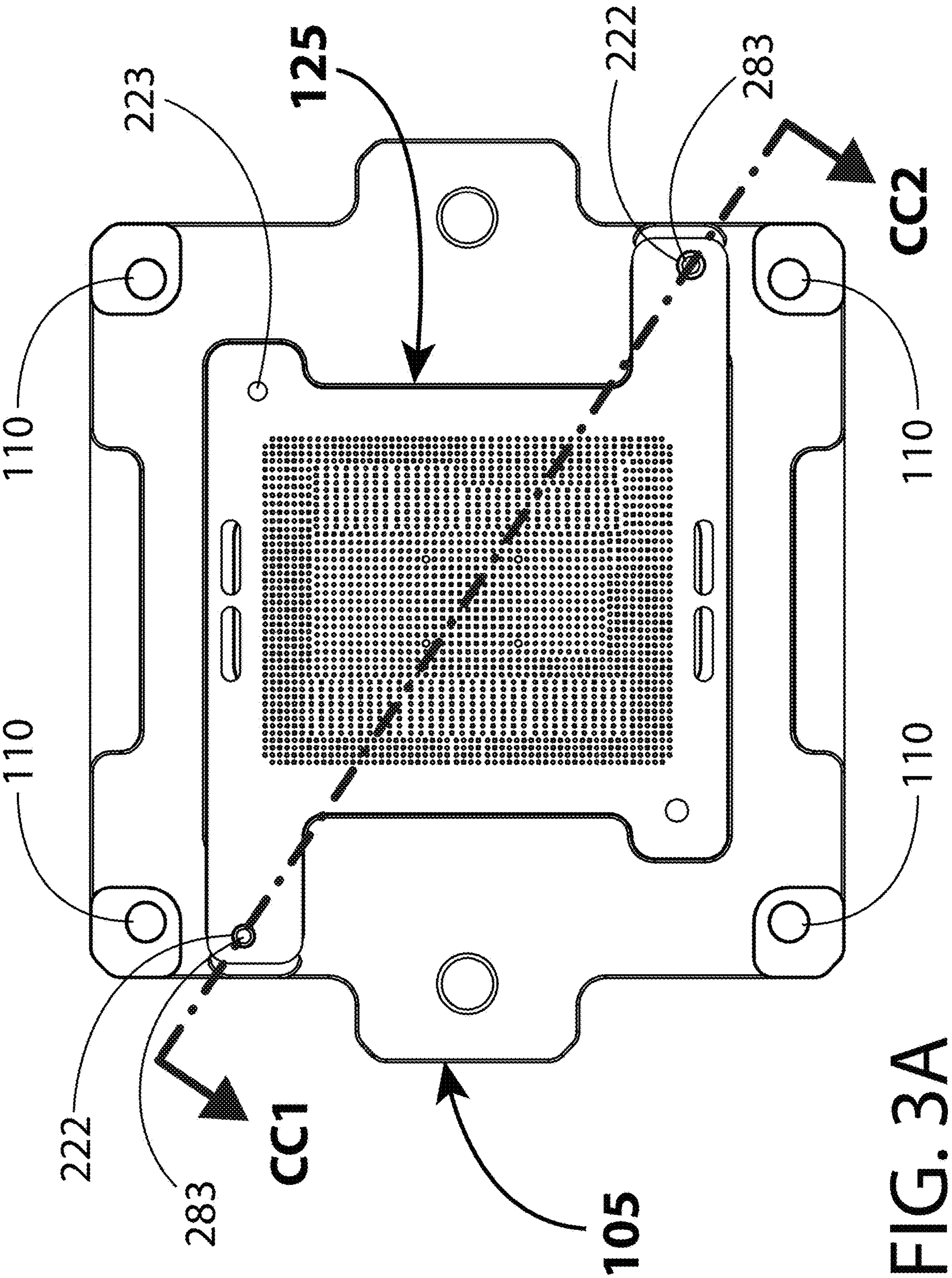
FIG. 3A is a plan view from below illustrating the assembled and unmounted contact interface defining a diagonal section line.
Figure 3B:
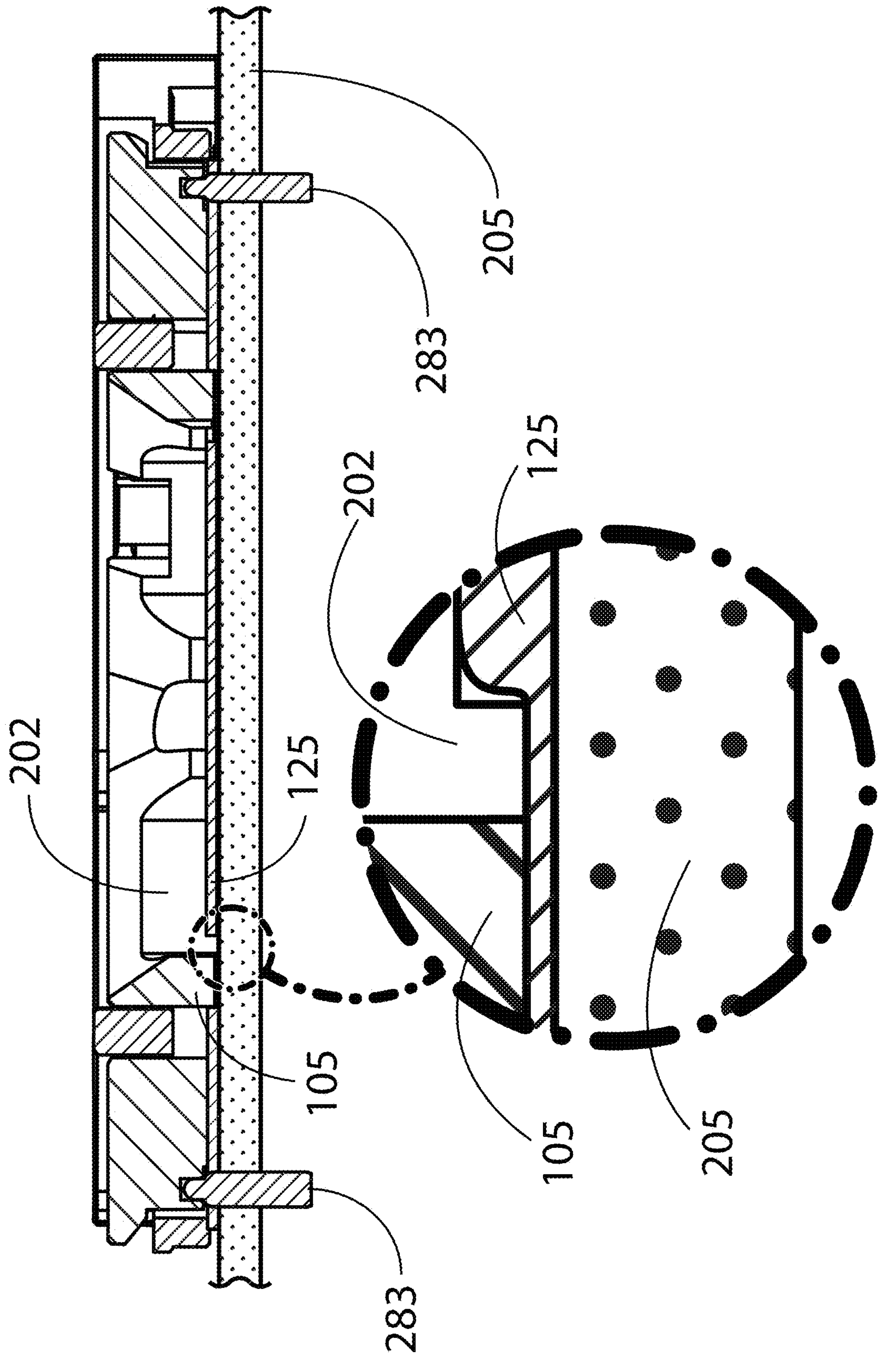
FIG. 3B shows the view along a diagonal cross-section of FIG. 3A.

FIG. 3A is a plan view from below of a partly assembled quick change connector as seen in FIG. 2B in accordance with this description. Here, the intended position of locating pins 283 are shown within the locating holes 222 in the elastomeric sheet. Section line CC1-CC2, drawn through the center of the intended position of locating pins 283, is used to explore the internal structure when assembled. FIG. 3B shows the assembled quick-change connector of FIG. 2B with the upper member 202 sectioned along line CC1-CC2. Locating pins 283 for the elastomeric sheet 125 are shown with matching relief in mechanically overlying parts. Any securing forces or pressures may be applied primarily at the periphery of the upper member 202 and there is no requirement for any force applied outside of the extent of this periphery, but manufacturing tolerances may result in some clamping forces. The enlarged area shows that the clamping force results in some small pinching of the elastomer 125 which is sufficient to prevent any movement.

A small clamping force can be applied to the elastomer. For example, a pinching displacement in the neighborhood of 0.001" to 0.003" is considered sufficient and any greater risks a permanent set in the elastomer which is undesirable because it leads to stresses that cause the elastomer to wrinkle and be displaced from its design location in places that may be critical. Further, it is not desirable that the operator or technician be required to exert excessive force to engage the upper member with the lower member. When the elastomer is free floating, a clearance between the upper member 202 and the elastomer of between 0.001" and 0.003" minimizes any risk of ripples or wrinkles forming in the elastomer thus risking damage and limiting reuse. With these clearances, any wrinkling tendency is constrained by the proximity of the floor of the upper member and translates into small compressive forces that are distributed throughout the elastomer in a plane parallel to and between the floor of the upper member and the surface of the test circuit board.

In operation, downward force by the device insertion robot holds the DUT contacts firmly against the elastomeric sheet and contact is made through the conductive path elements within the sheet. Any conductive elements that are not underneath the contacts on the DUT simply do not make contact and play no part in the operation of the quick-change contact interface.

When wear occurs and the elastomer performance has degraded to a predetermined value the operator of the test jig may simply release the latches using finger or fingernail upward pressure on the arms 115 which allows the upper member 202 to spring up slightly as the compressed region of a pinched elastomer recovers its original un-pinched dimensions or as the latches disengage using spring pressure to assist if so incorporated. After release, the upper member may then be removed and, if a single piece assembly, may simply be replaced as a whole. If not a single component, then once the upper member is removed, the elastomer preformed sheet may be removed and a fresh or reconditioned replacement elastomeric sheet inserted. The upper member 202 is then pressed, using downward finger pressure on the arms 115, into the operating position and operation is restored.

In sum, various aspects of the present invention provide a quick-change connection system for a changeable toolless retainer assembly to replace wearing parts in a semiconductor testing application that does not require the availability of any tools and demands only simple manual dexterity to facilitate this replacement. This quick-change connection system solves the need to restore the wearing parts of a high volume test equipment interconnection to like new condition. The advantages of such a system include the ability to easily service the common wear points at device testing stations and to do so without needing highly skilled personnel or the use of tools.

Accordingly, a semiconductor device-under-test ("DUT") is automatically positioned for insertion into the retainer assembly and the electrical connections are made using an elastomeric sheet. This elastomeric sheet is selectively conductive in one dimension and can be either a single replaceable element or may be incorporated as a permanent part of another component of the test jig. A test circuit board connects external test equipment to a fixed durable lower housing member that allows the easy insertion and removal of an upper housing member, that accommodates the semiconductor DUT, by hand without the use of tools.

The lower housing member includes features that allow a robotic insertion device to maintain consistent alignment with the test circuit board, during the insertion of a semiconductor device to be tested, to which the lower member is attached. The upper housing member is pushed into the lower housing member and is aligned and secured by features that engage positively with the lower housing member. The upper housing member includes elements that guide the DUT during insertion to ensure accurate placement and correct for minor axial or lateral uncertainty in the pickup mechanism of the insertion robot. The upper housing member uses deformable latches to secure it in the lower housing member and these latches can be released toollessly, by using finger pressure on protrusions formed on the latches. The axial alignment of the upper housing member is ensured by using alignment arms that fit closely into matching receptacles in the lower housing member. These alignment arms have features that allow finger pressure to lift the upper housing member from the lower housing member when released and this action may be aided by displaceable elements, such as springs, that are compressed when insertion forces are applied. Advantages of the resulting structure include dramatically speeding up the process of replacing worn out components and eliminating the need for the operator to use a disassembly tool.

In some embodiments, the elastomeric sheet is molded into the upper housing member, when test parameters taken from a number of devices are seen to shift in a way that indicates wear, the operator of the testing equipment can remove the upper housing member and replace it with a new upper housing member using only fingers. The alignment and security of the new upper housing member are assured using the alignment and retention features of the upper housing member.

Conversely, the elastomeric sheet can be a separate element with respect to the upper housing member, and wherein the upper housing member is first released by the operator and removed. A fingernail is then used to lift the elastomeric sheet from its position at a connection region on the test circuit board within the lower housing member. A replacement elastomeric sheet is then inserted and located with fiducial pins that are already on the test circuit board. The upper housing member may then be reinstalled to secure the elastomeric sheet or may be replaced with a new upper housing member. Installation forces are applied using only finger pressure until the latches on the upper housing member snap into place in matching features in the lower housing member.

1. In some embodiments, a toollessly changeable retainer assembly configured to connect a device-under-test (DUT) to a test circuit board, the retainer assembly comprises an upper housing member for mating with a lower housing member, and wherein the upper housing member includes a taper for aligning the DUT by displacing the DUT along at least one lateral or rotational freedom of movement axis during insertion of the DUT, one or more latches for securely engaging with a side wall of the lower housing member, and one or more alignment arms located in position while guided by one or more locating pegs of the lower housing member, an elastomeric sheet operatively coupled to and positioned at a base of the upper housing member, wherein the one or more alignment arms are provided to allow insertion pressure to be applied to the upper housing member thereby firmly pressed into position, and wherein conductive elements of the elastomeric sheet are configured to make direct electrical contact with both the DUT and a plurality of contact pads on the test circuit board, and wherein the one or more latches engage positively in matching locations in corresponding positions in the lower housing member, wherein the one or more latches are compatible with a user's finger size so that no disassembly tool is required for detaching the upper housing member from the lower housing member, and wherein the one or more latches are configured to be released by the user's finger so that the upper housing member can be detached thereby enabling the upper housing member to be removed and replaced with a new upper housing member toollessly.

2. The retainer assembly of clause 1 wherein the elastomeric sheet is permanently attached to the upper housing member.

3. The retainer assembly of clauses 1 or 2 wherein rotational uncertainty is reduced by providing bushings in the lower housing member for engaging locating pegs during insertion of the DUT into the retainer assembly.

4. The retainer assembly of any of clauses 1-3 wherein a corner piece for strengthening and reducing distortion of the upper housing member has a matching location to mate with the lower housing member so that the DUT is in alignment for insertion into the retainer assembly without interference.

5. The assembly of any of clauses 1-4 wherein the corner piece has a cavity for accepting an alignment pin located on the test circuit board.

6. The retainer assembly of any of clauses 1-5, the elastomeric sheet is in contact with contact points on the test circuit board and under compression between the DUT and the test circuit board.

7. The retainer assembly of any of clauses 1-6 wherein locating pins on the lower housing member are coupled with a close fit for the one or more alignment arms thereby reducing tendency of the upper housing member to yaw when mated to the lower housing member.

8. The retainer assembly of any of clauses 1-7 further comprising a release assist mechanism located between the upper housing member and the lower housing member to facilitate detachment of the upper housing member when replacing the upper housing member with the new upper housing member toollessly.

9. The retainer assembly of any of clauses 1-8 wherein the release assist mechanism provides an upward preload to the upper housing member to mitigate looseness resulting from wear of the one or more latches.

10. The retainer assembly of any of clauses 1-9 wherein the release assist mechanism includes projections on the one or more alignment arms that improve finger grip.

11. The retainer assembly of any of clauses 1-10 wherein the upper housing member is fabricated using a softer material relative to the lower housing member.

12. The retainer assembly of any of clauses 1-11 wherein the upper housing member is fabricated using a bearing grade plastic.

13. The retainer assembly of any of clauses 1-12 wherein the upper housing member is fabricated using a material that dissipates static electrical charge.

14. The retainer assembly of any of clauses 1-13 wherein the elastomeric sheet is free floating with respect to the upper housing member.

15. The retainer assembly of any of clauses 1-14 wherein the elastomeric sheet has a uniform distribution of the conductive elements.

16. The retainer assembly of any of clauses 1-15 wherein densities of the conductive elements of the elastomeric sheet are not uniform and are selected to match current flow needs of the DUT.

17. The retainer assembly of any of clauses 1-16 wherein the lower housing member is located by shoulders located at a lower face of the lower housing member, and wherein the shoulders are concentric with mounting screw holes in the lower housing member.

18. The retainer assembly of any of clauses 1-17 wherein the lower housing member includes bushings to receive alignment pins of a device insertion robot.

While this invention has been described in terms of several embodiments, there are alterations, modifications, permutations, and substitute equivalents, which fall within the scope of this invention. Although sub-section titles have been provided to aid in the description of the invention, these titles are merely illustrative and are not intended to limit the scope of the present invention.

It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A retainer assembly configured to connect a device-under-test (DUT) to a test circuit board, the retainer assembly comprising:

an upper housing member for mating with a lower housing member, and wherein the upper housing member includes:

a taper for aligning the DUT by displacing the DUT along at least one lateral or rotational freedom of movement axis during insertion of the DUT;

one or more latches for securely engaging with a side wall of the lower housing member; and one or more alignment arms located in position while guided by one or more locating pegs of the lower housing member;

an elastomeric sheet operatively coupled to and positioned at a base of the upper housing member, wherein the one or more alignment arms are provided to allow insertion pressure to be applied to the upper housing member thereby pressed into position, and wherein conductive elements of the elastomeric sheet are configured to make direct electrical contact with both the DUT and a plurality of contact pads on the test circuit board; and wherein the one or more latches engage positively in matching locations in corresponding positions in the lower housing member, wherein the one or more latches are configured to be released without use of a tool for detaching the upper housing member from the lower housing member enabling the upper housing member to be removed and replaced with a new upper housing member.

2. The retainer assembly of claim 1 wherein the elastomeric sheet is permanently attached to the upper housing member.

3. The retainer assembly of claim 1 wherein rotational uncertainty is reduced by providing bushings in the lower housing member for engaging locating pegs during insertion of the DUT into the retainer assembly.

4. The retainer assembly of claim 1 wherein a corner piece for strengthening and reducing distortion of the upper housing member has a matching location to mate with the lower housing member so that the DUT is in alignment for insertion into the retainer assembly without interference.

5. The retainer assembly of claim 4 wherein the corner piece has a cavity for accepting an alignment pin located on the test circuit board.

6. The retainer assembly of claim 1 wherein when the retainer assembly is assembled, the elastomeric sheet is in contact with contact points on the test circuit board and under compression between the DUT and the test circuit board.

7. The retainer assembly of claim 1 wherein locating pins on the lower housing member are coupled with a close fit for the one or more alignment arms thereby reducing tendency of the upper housing member to yaw when mated to the lower housing member.

8. The retainer assembly of claim 1 further comprising a release assist mechanism located between the upper housing member and the lower housing member to facilitate detachment of the upper housing member when replacing the upper housing member with the new upper housing member.

9. The retainer assembly of claim 8 wherein the release assist mechanism provides an upward preload to the upper housing member to mitigate looseness resulting from wear of the one or more latches.

10. The retainer assembly of claim 8 wherein the release assist mechanism includes projections on the one or more alignment arms.

11. The retainer assembly of claim 1 wherein the upper housing member is fabricated using a softer material relative to the lower housing member.

12. The retainer assembly of claim 11 wherein the upper housing member is fabricated using a bearing grade plastic.

13. The retainer assembly of claim 11 wherein the upper housing member is fabricated using a material that dissipates static electrical charge.

14. The retainer assembly of claim 1 wherein the elastomeric sheet is free floating with respect to the upper housing member.

15. The retainer assembly of claim 1 wherein the elastomeric sheet has a uniform distribution of the conductive elements.

16. The retainer assembly of claim 1 wherein densities of the conductive elements of the elastomeric sheet are not uniform and are selected to match current flow needs of the DUT.

17. The retainer assembly of claim 1 wherein the lower housing member is located by shoulders located at a lower face of the lower housing member, and wherein the shoulders are concentric with mounting screw holes in the lower housing member.

18. The retainer assembly of claim 1 wherein the lower housing member includes bushings to receive alignment pins of a device insertion robot.

* * * * *